United States Patent [19]
Yeh et al.

[11] Patent Number: 6,008,100
[45] Date of Patent: Dec. 28, 1999

[54] METAL-OXIDE SEMICONDUCTOR FIELD EFFECT TRANSISTOR DEVICE FABRICATION PROCESS

[75] Inventors: Wen-Kuan Yeh, Hsinchu Hsien; Jih-Wen Chou, Hsinchu; Shih-Wei Sun, Taipei, all of Taiwan

[73] Assignee: United Microelectronics Corp., Hsin-Chu, Taiwan

[21] Appl. No.: 09/056,231

[22] Filed: Apr. 7, 1998

[30] Foreign Application Priority Data

Dec. 22, 1997 [TW] Taiwan ................................. 86119489

[51] Int. Cl.⁶ .................................................. H01L 21/336
[52] U.S. Cl. .......................... 438/305; 438/301; 438/303; 438/585; 430/313; 430/319; 430/331
[58] Field of Search ..................................... 438/301, 303, 438/305, 585; 430/313, 319, 331

[56] References Cited

U.S. PATENT DOCUMENTS

| | | | |
|---|---|---|---|
| 4,394,182 | 7/1983 | Maddox, III | 148/1.5 |
| 5,156,986 | 10/1992 | Wei et al. | 437/40 |
| 5,830,605 | 11/1998 | Umeki et al. | 430/5 |
| 5,830,787 | 11/1998 | Kim | 438/163 |

*Primary Examiner*—John F. Niebling
*Assistant Examiner*—Alexander G. Ghyka
*Attorney, Agent, or Firm*—Christie, Parker & Hale, LLP

[57] ABSTRACT

A method of fabricating a MOS FET is provided. An oxide layer and a polysilicon layer are successively formed on the semiconductor substrate. A pyramidical photoresist layer is used as a mask for forming a hat-shaped gate structure. A first ion implantation process is performed to form an LDD structure.

24 Claims, 4 Drawing Sheets

METAL-OXIDE SEMICONDUCTOR FIELD EFFECT TRANSISTOR DEVICE FABRICATION PROCESS

CROSS-REFERENCE TO RELATED APPLICATION

This application claims the priority benefit of Taiwan application serial no. 86119489, filed Dec. 22, 1997, the full disclosure of which is incorporated herein by reference.

BACKGROUND OF THE INVENTION

FIELD OF THE INVENTION

This invention relates in general to the fabrication of metal oxide semiconductor field effect transistor (MOSFET), and more particularly to the fabricating of a lightly doped drain (LDD) structure. A gate with a particular configuration is formed by a photoresist layer with a particular configuration. Then, a step of ion implantation is performed, using the gate with a particular configuration as a mask, to form a lightly doped drain structure of a MOSFET.

One of the most important tendency of modern integrated circuit (IC) fabricating technique is to develop smaller line width devices. As the channel length is reduced but the voltage provided remains as usual, the lateral electric field of the channel increases. Therefore, the energy of the electrons in the channel obtained from electric field speeding increases, especially in the area around the junction of the channel and the source/drain region. These electrons have higher energy than other electrons in thermal equilibrium so that they are called hot electrons. Some of the hot electrons even arrive in the gate oxide layer. The resulting electric holes immigrate to the semiconductor substrate and therefore results in leakage current.

To reduce the hot electron effect as fabricating a short channel MOS, the design of an LDD structure is used to prevent leakage current. The LDD structure includes a more lightly doped region near the channel.

To further understand the LDD structure of a MOS field effect transistor, an NMOS on a p-substrate is taken as an example.

Referring to FIG. 1A, on a p-substrate 1, a field region 2 is formed to isolate the adjacent MOS device. The field region 2 can be formed by local oxidation of silicon (LOCOS) or shallow trench isolation (STI). STI technique is performed by first forming trenches in the p-substrate 1 and then filling oxide into the trenches, using chemical vapor deposition, to form field oxide region 2. An oxide layer 4 is then formed by thermal oxidation. A polysilicon layer 6 is formed on the oxide layer. The polysilicon layer 6 is typically formed by depositing polysilicon, using low pressure chemical vapor deposition (LPCVD), doping and finally annealing to activate the dopant so that the conductivity of the polysilicon layer is increased. Then, a photoresist layer 8 is formed on the polysilicon layer 6.

Next, referring to FIG. 1B, the photoresist layer 8 is patterned to form a photoresist layer 8a. Using the patterned photoresist layer 8a as a mask, the oxide layer 4 and the polysilicon layer 6 are anisotropically etched to define the gate oxide layer 4a and the gate polysilicon layer 6a.

Referring to FIG. 1C, the patterned photoresist layer 8a is removed.

Then, PMOSs on the substrate 1 are covered by a mask (not shown). Referring to FIG. 1D, ion implantation process is performed to form a lightly doped source/drain region 10 with $1 \times 10^{13}/cm^2 \sim 1 \times 10^{14}/cm^2$ of $P^{31}$ using an energy level of about 30 KeV~100 keV. The doping depth is about 0.02 $\mu$m~0.15 $\mu$m.

Referring to FIG. 1E, an oxide layer is deposited over the whole surface of the device structure by chemical vapor deposition. An anisotropic etching back is performed to etch back the oxide layer to form a spacer 12 around the gate polysilicon layer 6a and gate oxide layer 4a.

Referring to FIG. 1F dopant of high concentration is than implanted into the substrate. After annealing, source/drain regions with LDD structure, having a first concentration region 10a and a second concentration region 10b are formed. The dopant concentration of the first concentration region 10a is lower than the one of the second concentration region 10b. The high concentration dopant can be $P^{31}$, the energy can be about 150 KeV~500 KeV, the dosage of the ion implanted can be $1 \times 10^{13}/cm^2 \sim 1 \times 10^{14}/cm^2$ and the depth can be about 0.2 $\mu$m~0.6 $\mu$m.

Conventionally, two masks and two steps of ion implantation for lightly doped drain structure are required for a substrate having both NMOS FETs and PMOS FETs. Also, after the formation of the spacers, further two masks and two ion implantation steps for forming source/drain regions are needed for forming the whole LDD structure.

SUMMARY OF THE INVENTION

It is therefore an object of the present invention to provide a simplified method of forming a MOS FET with LDD structure, using a pyramidical photoresist mask and a hat-shaped gate structure.

It is another object of the invention to provide a method which adjusts the angle of incident light to form the pyramidical photoresist mask.

It is another object of the invention to provide a method which forms a third concentration region of the LDD structure, which is a heavily doped region so that the short channel effect is prevented.

It is a further object of the invention to provide a method which forms a spacer around the hat-shaped gate structure to form the third concentration region.

A method of fabricating a MOS FET is provided. An oxide layer and a polysilicon layer are successively formed on the semiconductor substrate. A pyramidical photoresist layer is used as a mask for forming a hat-shaped gate structure. A first ion implantation process is performed to form an LDD structure.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
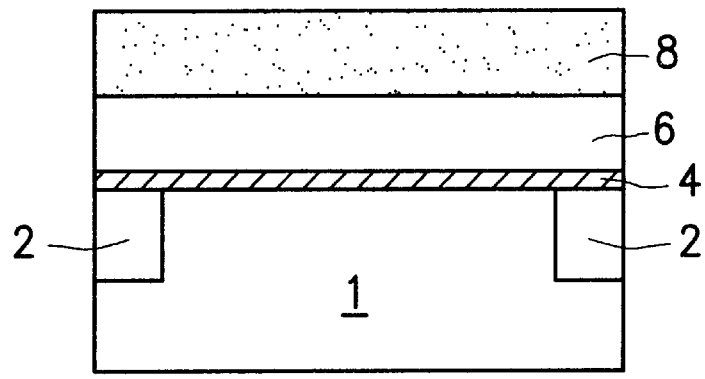
FIGS. 1A to 1F (Prior Art) are cross-sectional views showing the process steps of fabricating a conventional LDD structure of a MOS FET.
Figure 1B:
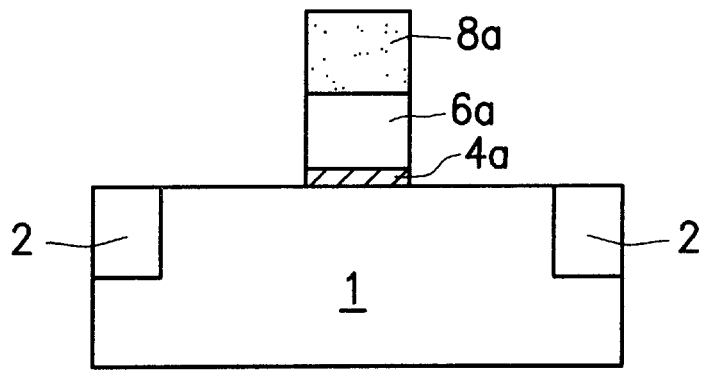
Figure 1C:
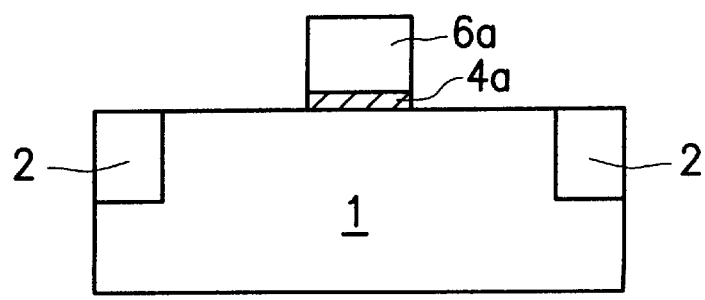
Figure 1D:
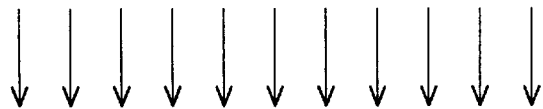
Figure 1D:
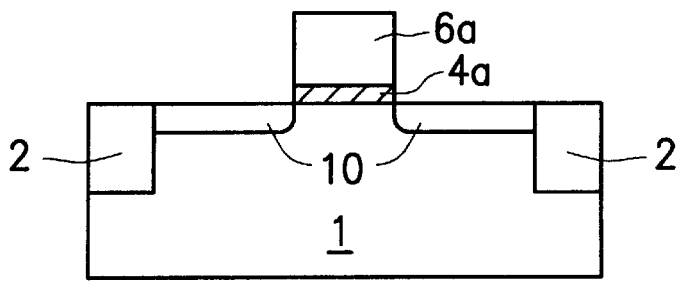
Figure 1E:
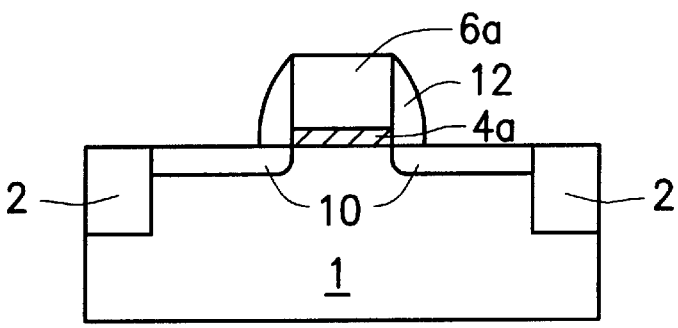
Figure 1F:
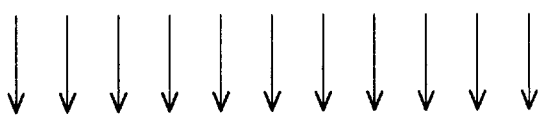
Figure 1F:
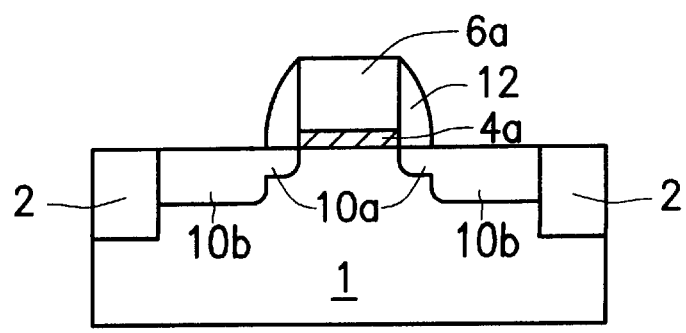
Figure 2A:
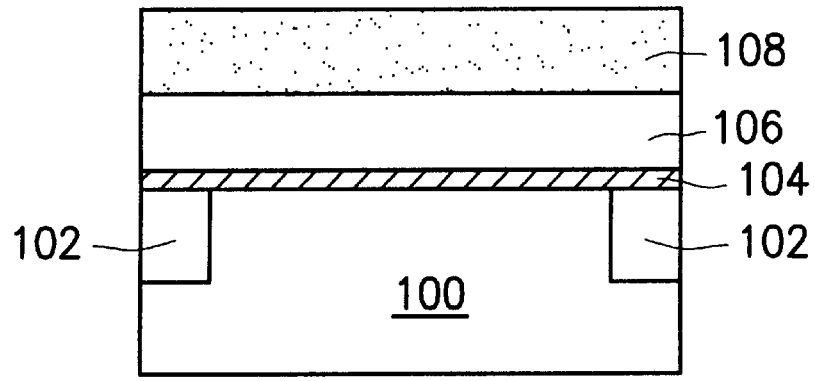
FIGS. 2A to 2F are cross-sectional views showing the process steps of fabricating an LDD structure of a MOSFET in accordance with a preferred embodiment of the invention.

Referring to FIG. 2A, a p-type substrate 100 is provided. Field regions 102 are formed around an active regions to isolate the MOS devices. Preferably, LOCOS technique and the STI technique are utilized to form field regions. To form an STI structure, the p-type substrate 100 is etched to form a trench, the trench is than filled with oxide by chemical vapor deposition to form field region 102. A thermal oxidation process is then performed to form an oxide layer 104 over the whole surface of the p-type semiconductor substrate 100. A polysilicon layer 106 is preferably formed by LPCVD, doping, and than annealing to increase the conductivity of the polysilicon layer. Then, a photoresist layer 108 is formed on the polysilicon layer 106.

Figure 2B:
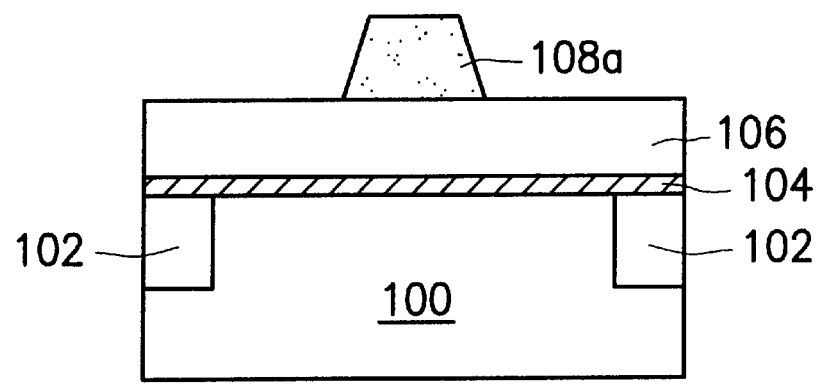

Next, referring to FIG. 2B, the photoresist layer 108 is preferably patterned to be pyramidical photoresist layer 108a. This pyramidical photoresist layer 108a can be achieved by adjusting the angle of incident light during the process of exposure.

Figure 2C:
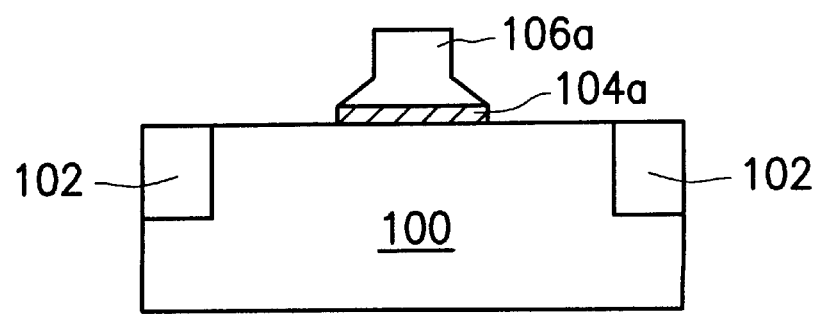

Referring to FIG. 2C, the polysilicon layer 106 and the oxide layer 104 are etched, using the pyramidical photoresist layer 108a as a mask, to form a hat-shaped gate polysilicon layer 106a and gate oxide layer 104a. The desired hat-shaped gate polysilicon layer 106a can be obtained by using at least two kinds of etchant with different etching rate or different etching conditions.

Figure 2D:
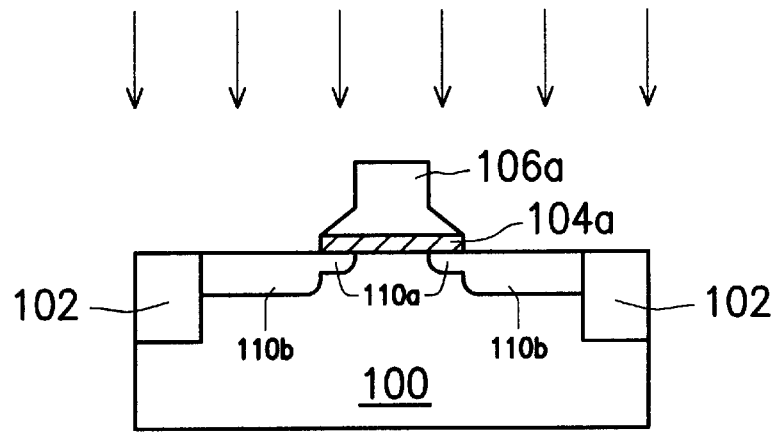

A mask (not shown) is used to cover the PMOS. Referring to FIG. 2D, after ion implantation and annealing, source/drain regions with LDD structures are formed. The LDD structure has a first concentration region 110a and a second concentration region 110b. The dopant concentration of the first concentration region 110a is lower than that of the second concentration region 110b. In this step, the protrusion at the lower edge of the hat-shaped gate polysilicon 106a is used as a mask for ion implantation to form regions with different dopant concentration. Preferably, $P^{31}$ is used as doping ions, with an implanting energy of about 30 KeV~100 KeV and a dosage of about $1\times10^{13}/cm^2 \sim 1\times10^{14}/cm^2$. The depth of ion implantation is about 0.02 μm~0.15 μm.

Figure 2E:
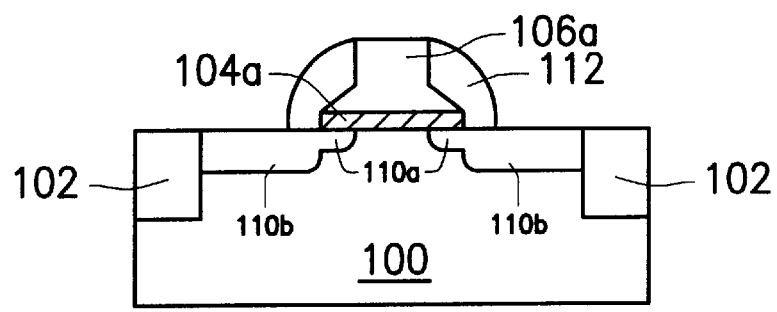

Next, referring to FIG. 2E, an oxide layer is deposited over the whole surface of the device by CVD. The oxide layer is then etched back anisotropically to form a spacer 112 around the gate polysilicon layer 106a and gate oxide layer 104a.

Figure 2F:
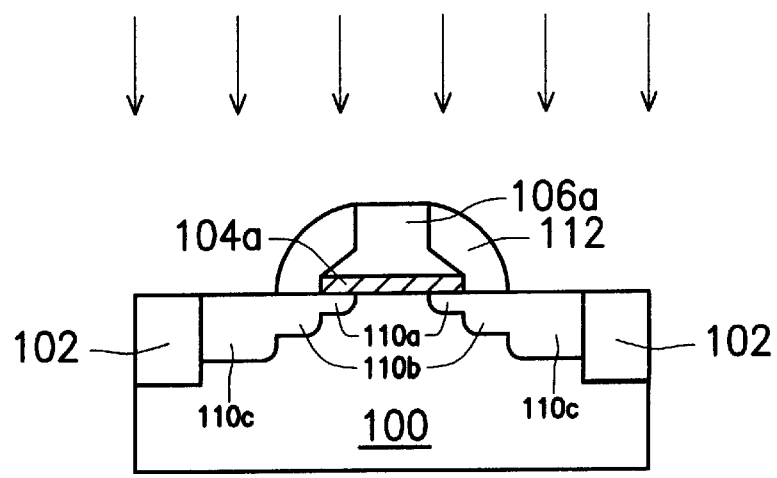

Referring to FIG. 2F, a further ion implantation step and annealing step are performed to form a third concentration region 110c, using the spacer 112 as a mask. The first concentration region 110a, the second concentration region 110b and the third concentration region 110c together form the LDD structure of the source/drain regions. The dopant concentration of the first concentration region 110a is lower than that of the second concentration region 110b. The dopant concentration of the second concentration region 110b is lower than that of the third concentration region 110c. $P^{31}$ is the preferred ion for doping. The energy for implantation is about 150 KeV~500 KeV. The dosage is about $1\times10^{13}/cm^2 \sim 1\times10^{14}/cm^2$. The depth of ion implantation is about 0.2 μm~0.6 μm. The continuous processes such as self-aligned silicide (salicide) are as conventional.

Conventionally, the salicide formed on the surface of the source/drain region is fairly near to the lightly doped region of the source/drain regions with LDD structures. Consequently, degradation tends to occur at the junction of source/drain regions. However, the LDD structure fabricated by the method of the invention prevents the problem of degradation since the spacer formed around the gate polysilicon layer 106a and the gate oxide layer 104a extends the distance between the salicide on the source/drain region and the lightly doped region.

The present invention utilizes the hat-shaped gate polysilicon layer as a mask for ion implantation so that source/drain regions with LDD structures of different dopant concentrations can be completed in a single ion implantation step. Therefore, the method according to the invention is simplified because less step of ion implantation is needed.

Additionally, since smaller linewidth is the great tendency of fabricating a semiconductor device, the conventional LDD structure suffers from a problem that the heavily doped regions are too near to each other, which causes short channel effect. According to the present invention, source/drain regions with LDD structures have at least two regions with different concentrations and the distance between the two most heavily doped source/drain regions is extended. As a result, the occurrence of shot channel effect is prevented.

While the invention has been described by way of example and terms of the preferred embodiment, it is to be understood that the invention is not limited thereto. To the contrary, it is intended to cover various modifications and similar arrangements. The appended claims, therefore, should be accorded the broadest interpretation so as to encompass all such modifications and similar arrangements.

What is claimed is:

1. A method of fabricating a metal-oxide-semiconductor field effect transistor (MOS FET), comprising:

providing a semiconductor substrate;

forming an oxide layer on the semiconductor substrate;

forming a polysilicon layer on the oxide layer;

forming a photoresist layer on the polysilicon layer;

patterning the photoresist layer to form a pyramidical photoresist layer;

etching the polysilicon layer and the oxide layer, using the pyramidical photoresist layer as a mask, to form a hat-shaped gate structure;

removing the pyramidical photoresist layer; and performing an ion implantation process and an annealing process to form source/drain regions with lightly doped drain structures.

2. A method as claimed in claim 1, wherein the pyramidical photoresist layer is formed by adjusting an angle of incident light.

3. A method as claimed in claim 2, wherein the pyramidical photoresist layer has a narrower upper portion and a wider lower portion.

4. A method as claimed in claim 1, wherein the hat-shaped gate structure are formed by etching the polysilicon layer, using a plurality of etchant with different etching rate.

5. A method as claimed in claim 1, wherein the hat-shaped gate structure are formed by etching the polysilicon layer in different etching conditions.

6. A method as claimed in claim 4, wherein the hat-shaped gate structure has a narrower upper potion and a wider lower portion.

7. A method as claimed in claim 1, wherein phosphorous ions are used for the ion implantation process.

8. A method as claimed in claim 1, wherein an energy for the ion implantation process is about 30 KeV~100 KeV.

9. A method as claimed in claim 1, wherein a dosage for the ion implantation process is about $1\times10^{13}/cm^2 \sim 1\times10^{14}/cm^2$.

10. A method as claimed in claim 1, wherein a depth of ion implantation is about 0.02 μm~0.15 μm.

11. A method of fabricating a metal-oxide-semiconductor field effect transistor (MOS FET), comprising:

providing a semiconductor substrate;

forming an oxide layer on the semiconductor substrate;

forming a polysilicon layer on the oxide layer;

forming a photoresist layer on the polysilicon layer;

patterning the photoresist layer to form a pyramidical photoresist layer;

etching the polysilicon layer and the oxide layer, using the pyramidical photoresist layer as a mask, to form a hat-shaped gate structure;

removing the pyramidical photoresist layer;

performing a first ion implantation process and a first annealing process to form source/drain regions with a first concentration region and a second concentration region wherein a dopant concentration of the first concentration region is lower than a dopant concentration of the second concentration region;

forming a spacer around the hat-shaped structure; and performing a second ion implantation process, using the spacer as a mask, and a second annealing process to form a third concentration region wherein the dopant concentration of the second concentration region is lower than a dopant concentration of the third concentration region.

12. A method as claimed in claim 11, wherein the pyramidical photoresist layer is formed by adjusting an angle of incident light.

13. A method as claimed in claim 12, wherein the pyramidical photoresist layer has a narrower upper portion and a wider lower portion.

14. A method as claimed in claim 11, wherein the hat-shaped gate structure are formed by etching the polysilicon layer, using a plurality of etchant with different etching rate.

15. A method as claimed in claim 11, wherein the hat-shaped gate structure are formed by etching the polysilicon layer in different etching conditions.

16. A method as claimed in claim 4, wherein the hat-shaped gate structure has a narrower upper potion and a wider lower portion.

17. A method as claimed in claim 11, wherein phosphorous ions a re used for the first ion implantation process.

18. A method as claimed in claim 11, wherein an energy for the first ion implantation process is about 30 KeV~100 KeV.

19. A method as claimed in claim 11, wherein a dosage for the first ion implantation process is about $1 \times 10^{13}/cm^2 \sim 1 \times 10^{14}/cm^2$.

20. A method as claimed in claim 11, wherein a depth of the first ion implantation process is about 0.02 μm~0.15 μm.

21. A method as claimed in claim 11, wherein phosphorous ions are used for the second ion implantation process.

22. A method as claimed in claim 11, wherein an energy for the second ion implantation process is about 150 KeV~500 KeV.

23. A method as claimed in claim 11, wherein a dosage for the second ion implantation process is about $1 \times 10^{13}/cm^2 \sim 1 \times 10^{14}/cm^2$.

24. A method as claimed in claim 11, wherein a depth of the second ion implantation process is about 0.2 μm~0.6 μm.

* * * * *